(12) United States Patent
Aritome et al.

(10) Patent No.: US 8,717,819 B2
(45) Date of Patent: May 6, 2014

(54) NAND FLASH MEMORY PROGRAMMING

(75) Inventors: Seiichi Aritome, Boise, ID (US); Haitao Liu, Meridian, ID (US); Di Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 13/549,743

(22) Filed: Jul. 16, 2012

(65) Prior Publication Data

US 2012/0275227 A1    Nov. 1, 2012

Related U.S. Application Data

(60) Continuation of application No. 12/627,448, filed on Nov. 30, 2009, now Pat. No. 8,223,549, which is a division of application No. 11/495,507, filed on Jul. 28, 2006, now Pat. No. 7,626,866.

(51) Int. Cl.
G11C 11/34 (2006.01)

(52) U.S. Cl.
USPC ............. 365/185.18; 365/185.14; 365/185.19

(58) Field of Classification Search
USPC ........................... 365/185.18, 185.14, 185.19
See application file for complete search history.

(56) References Cited

U.S. PATENT DOCUMENTS

| | | | |
|---|---|---|---|
| 4,687,117 A | 8/1987 | Terauds | |
| 6,525,964 B2 | 2/2003 | Tanaka et al. | |
| 6,576,513 B2 | 6/2003 | Yim et al. | |
| 6,580,639 B1 | 6/2003 | He et al. | |
| 6,614,688 B2 | 9/2003 | Jeong et al. | |
| 6,661,707 B2 | 12/2003 | Choi et al. | |
| 6,747,899 B2 | 6/2004 | Hsia et al. | |
| 6,859,397 B2 | 2/2005 | Lutze et al. | |
| 6,885,587 B2 * | 4/2005 | Yang et al. | 365/185.18 |
| 6,930,921 B2 | 8/2005 | Matsunaga et al. | |
| 6,996,024 B2 * | 2/2006 | Tanzawa et al. | 365/226 |
| 7,023,733 B2 | 4/2006 | Guterman et al. | |
| 7,023,740 B1 | 4/2006 | Wong et al. | |
| 2006/0044872 A1 | 3/2006 | Nazarian | |

* cited by examiner

Primary Examiner — Son Dinh
(74) Attorney, Agent, or Firm — Leffert Jay & Polglaze, P.A.

(57) ABSTRACT

A programming method and memory structure for preventing punch-through in a short channel source-side select gate structure includes adjusting voltages on the selected and unselected bitlines, and the program, pass, and select gate voltages.

20 Claims, 8 Drawing Sheets

NAND FLASH MEMORY PROGRAMMING

RELATED APPLICATION

This Application is a Continuation of U.S. application Ser. No. 12/627,448 now U.S. Pat. No. 8,223,549 (Allowed), which is a Divisional of U.S. application Ser. No. 11/495,507, titled "NAND FLASH MEMORY PROGRAMMING," filed Jul. 28, 2006, (now U.S. Pat. No. 7,626,866) which are commonly assigned and incorporated herein by reference.

FIELD

The present invention relates generally to NAND memories and in particular the present invention relates to programming NAND memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density. One way to accomplish these tasks is by decreasing the size of the memory array and its individual devices.

Select gates for NAND structures are typically 150-200 nanometers (nm) in length. With the increasing pressure on making devices smaller, select gate sizes are continuing to decrease. For example, commonly owned disclosure ( . . . ) describes select gate lengths of 50 nm or less. When such small distances separate gates and their underlying structures, the voltages and currents involved can break down the gaps between source and drain of cells of adjacent NAND strings, causing a large and undesirable current flow known as punch through. Typical voltages and a partial NAND memory are shown in FIG. 1.

For the reasons stated above, and for other reasons stated below which will become apparent to those skilled in the art upon reading and understanding the present specification, there is a need in the art for new programming methods for short channel select gate NAND memories.

DETAILED DESCRIPTION

Figure 1:
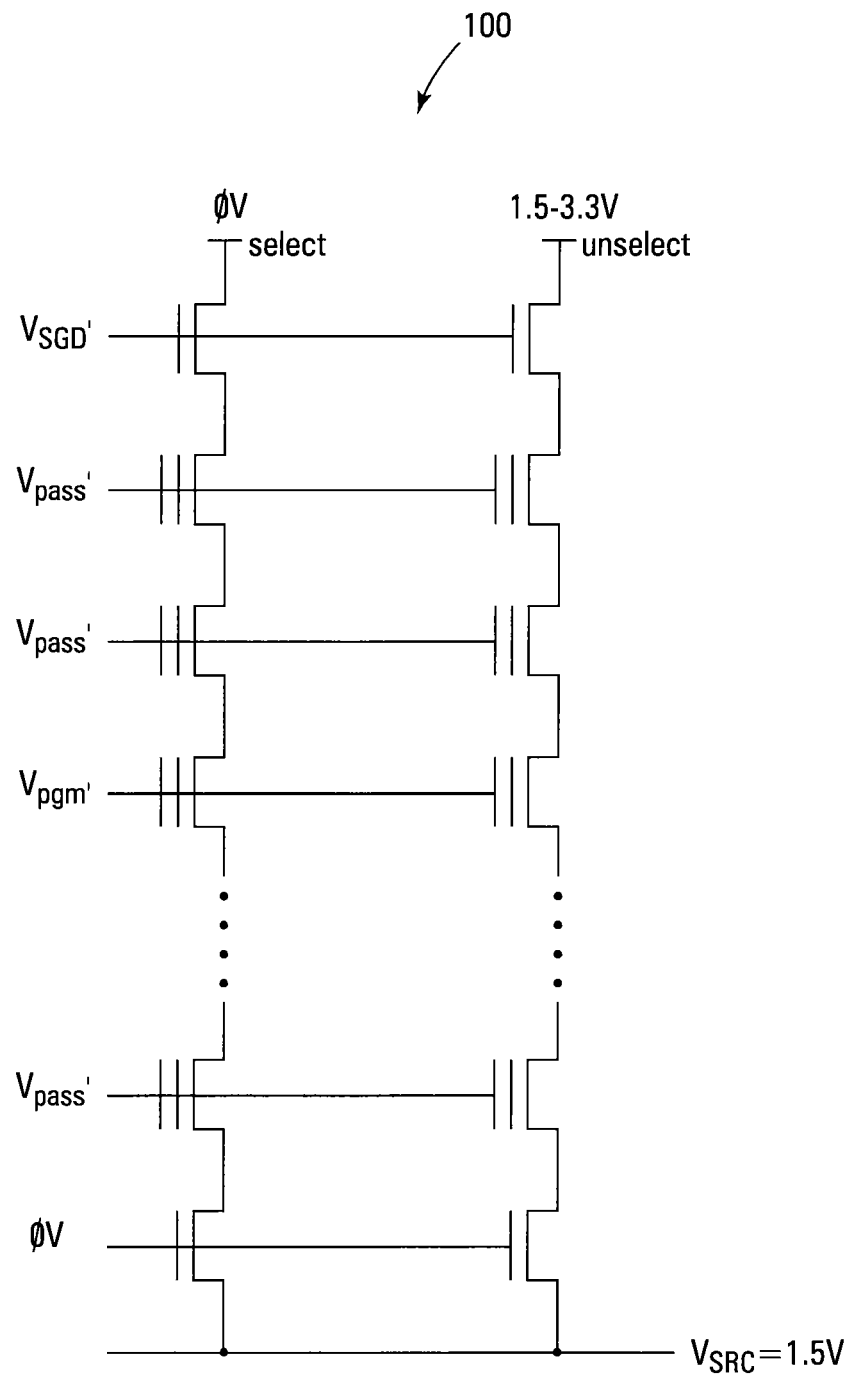
FIG. 1 is a diagram of a portion of a NAND memory with typical voltages shown.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

Figure 2:
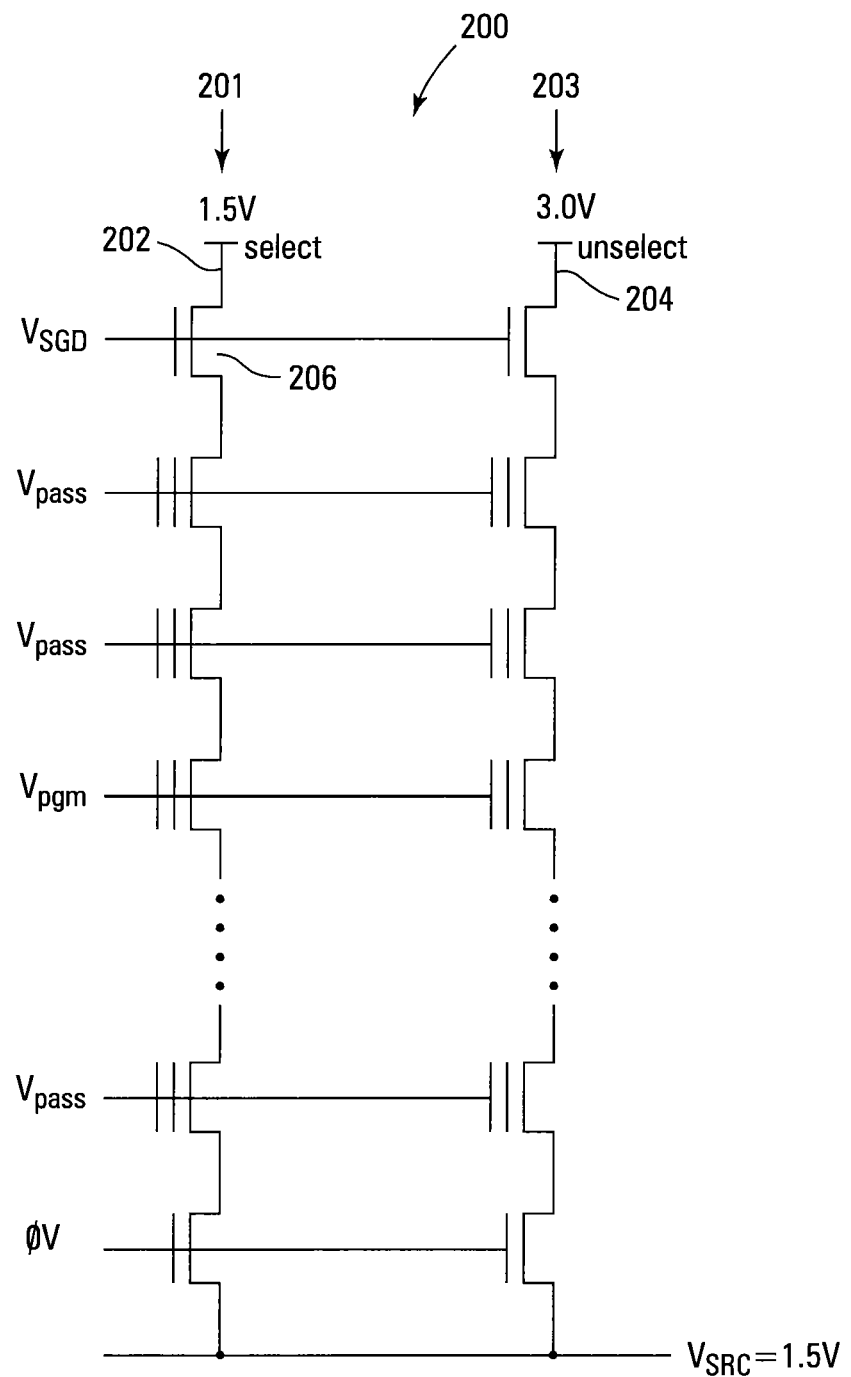
FIG. 2 is a diagram of a portion of a NAND memory with voltages according to one embodiment of the present invention.

In one embodiment of the present invention, when a short channel source-side select gate is used in a NAND memory, punch through is eliminated by varying the voltages for selected and unselected bitlines, as well as the voltages for drain select gate, pass, and program voltages. Referring to FIG. 2, a NAND memory 200 is shown in part. Memory 200 has a selected NAND string 201 and an unselected NAND string 203. In this embodiment, the bitline 202 connected to the selected NAND string 201 is biased to approximately 1.5 volts, whereas typical select bitlines are biased to 0 volts. The bitline 204 connected to the unselected NAND string 203 is biased to approximately 3.0 volts, whereas typical unselected bitlines are biased anywhere from 1.5 to 3.3 volts. The gate of drain select gate transistor 206 is biased to typical drain gate bias voltage plus the additional voltage applied to the selected bitline, in this embodiment 1.5 volts.

Further, the pass voltage, that is the voltage applied to non-programming word lines to allow their cells to act as pass transistors, which is typically approximately 9 volts, is raised by the same amount, again in this embodiment 1.5 volts, and the program voltage, typically approximately 20 volts, is also raised by the same amount. Punch through is stopped by the voltage placed on the selected bitline, allowing short channel source-side select gates to be used. This allows for a reduction in the amount of die real estate used for cells, and improves cell density.

Figure 3:
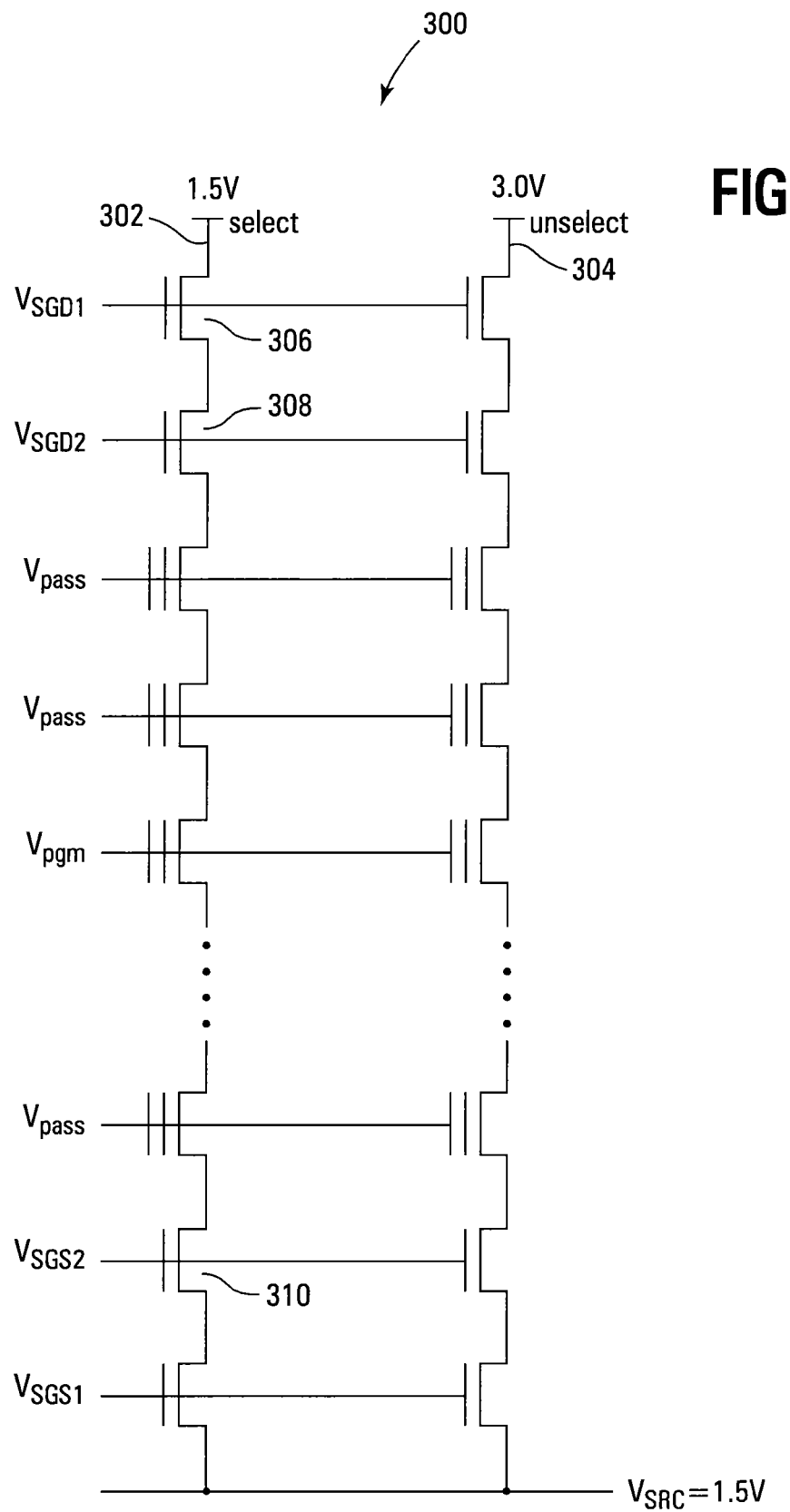
FIG. 3 is a diagram of a portion of a double select gate NAND memory with voltages according to another embodiment of the present invention.

Other NAND structures that are in use or are being developed will also be amenable to use with the method described above. For example, FIG. 3 shows part of a double select gate NAND memory 300. Each bitline for the double select gate NAND 300 has two drain select gate transistors and two source select gate transistors. For the double select gate NAND structure 300, selected bitline 302 has a voltage that is typically 0 volts. Unselected bitline 304 has typical voltage of 1.8 to 3.3 volts. In the embodiment shown, the voltage for selected bitline 302 is raised to approximately 1.5 volts, and the voltage for unselected bitline 304 is raised to approximately 3.0 volts. The gate of the first drain select gate transistor 306 is biased to typical drain gate bias voltage plus the additional voltage applied to the selected bitline, in this embodiment 1.5 volts. The gate of the second drain select gate transistor 308 is biased to approximately 0 volts (the approximate pass voltage for a read operation), as is the gate of the second source select gate transistor 310.

Further, the pass voltage, that is the voltage applied to non-programming word lines to allow their cells to act as pass transistors, which is typically approximately 9 volts, is raised by the same amount, again in this embodiment 1.5 volts, and the program voltage, typically approximately 20 volts, is also raised by the same amount. Punch through is stopped by the voltage placed on the selected bitline, allowing short channel source-side select gates to be used. This allows for a reduction in the amount of die real estate used for cells, and improves cell density.

Figure 4:
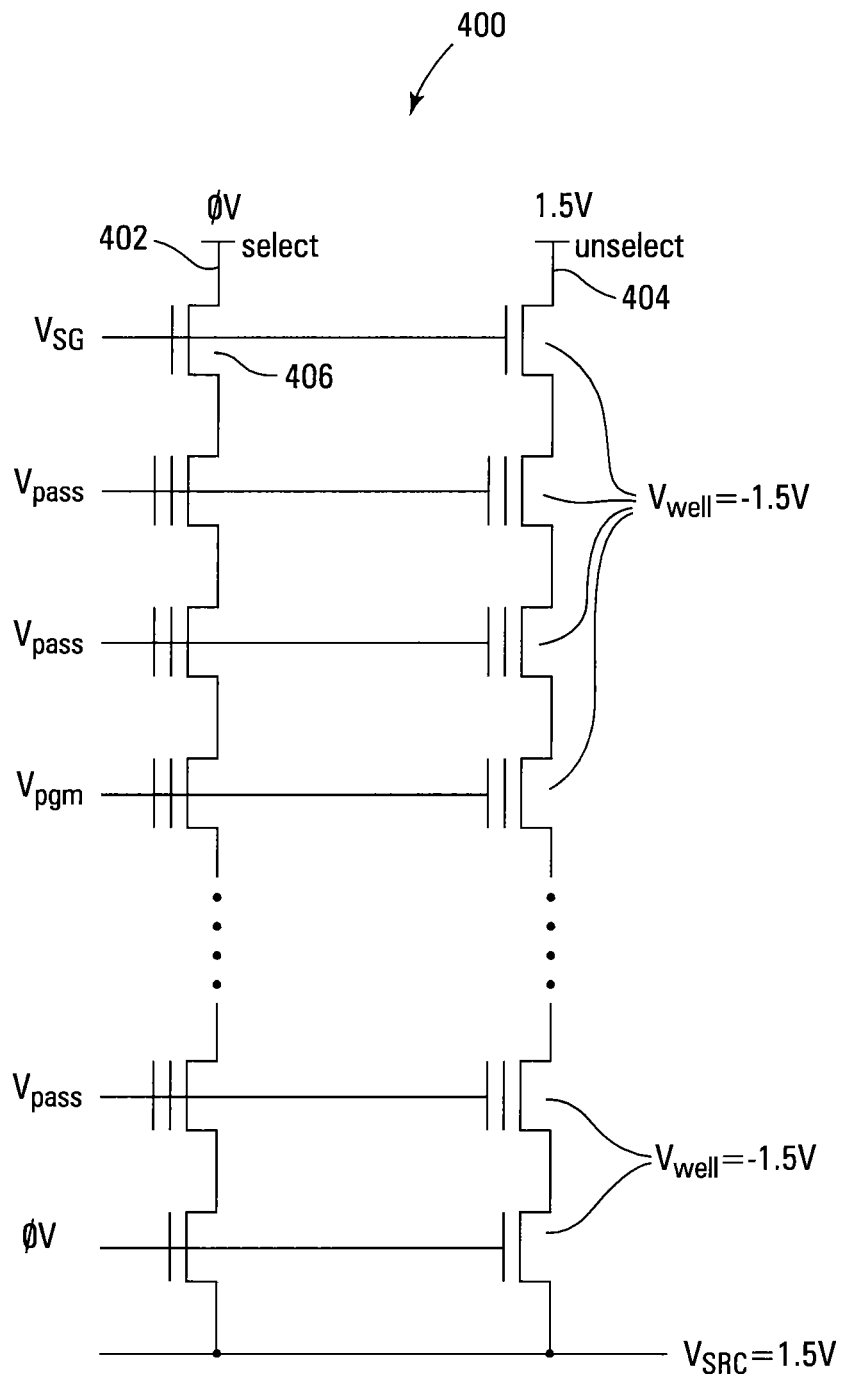
FIG. 4 is a diagram of a portion of a NAND memory with voltages according to another embodiment of the present invention.

In another embodiment, different voltages are adjusted to eliminate punch-through in a short channel source-side select gate NAND. Referring to FIG. 4, a portion of a NAND memory 400 is shown. In this embodiment, the structure of the NAND 400 is the same or substantially similar to that of NAND 200 described above. However, in this embodiment, the voltages on selected and unselected bitlines 402 and 404, respectively, remain the same as those of typical bitline voltages. The voltage of the p-well (or tub) is lowered to approximately −1.5 volts. The select gate 406 voltage is raised by approximately 1.5 volts. The pass and program voltages remain substantially the same in one embodiment for programming, but for an inhibit operation, the pass and program voltages are in one embodiment raised but are not required to be raised substantially. The raising of the program and pass voltages allows for better inhibit operation. The back-biasing of the p-well, accompanied by the raising of the drain select gate voltage to approximately 1.5 volts, eliminates punch through for short channel source-side select gates.

Figure 5:
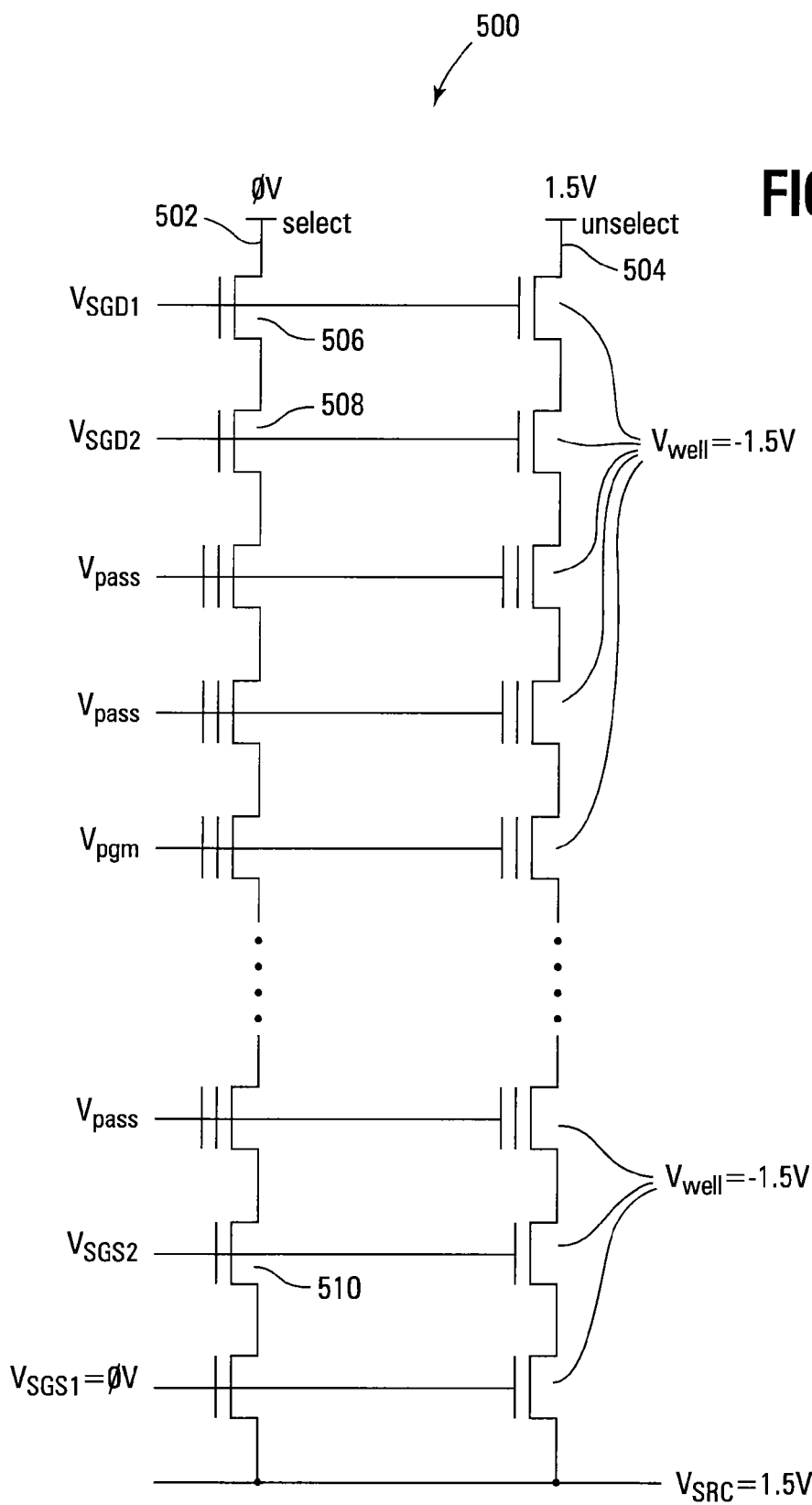
FIG. 5 is a diagram of a portion of a double select gate NAND memory with voltages according to another embodiment of the present invention.

Referring to FIG. 5, the method described above with respect to back-biasing the p-well voltage while raising the drain select gate voltage applies equally well to a double NAND structure such as double NAND 500. In this embodiment, the voltages applied to the selected and unselected bitlines 502 and 504 are approximately 0 and 1.5 volts, respectively. The tub or p-well voltage is biased to approximately −1.5 volts. The gate of the first drain select gate transistor 506 is raised by approximately 1.5 volts. The gate of the second drain select gate transistor 508 is biased to approximately 0 volts (the approximate pass voltage for a read operation), as is the gate of the second source select gate transistor 510.

The pass and program voltages remain substantially the same in one embodiment for programming, but for an inhibit operation, the pass and program voltages are in one embodiment raised but are not required to be raised substantially. The raising of the program and pass voltages allows for better inhibit operation. The back-biasing of the p-well, accompanied by the raising of the drain select gate voltage to approximately 1.5 volts, eliminates punch through for short channel source-side select gates.

Figure 5A:
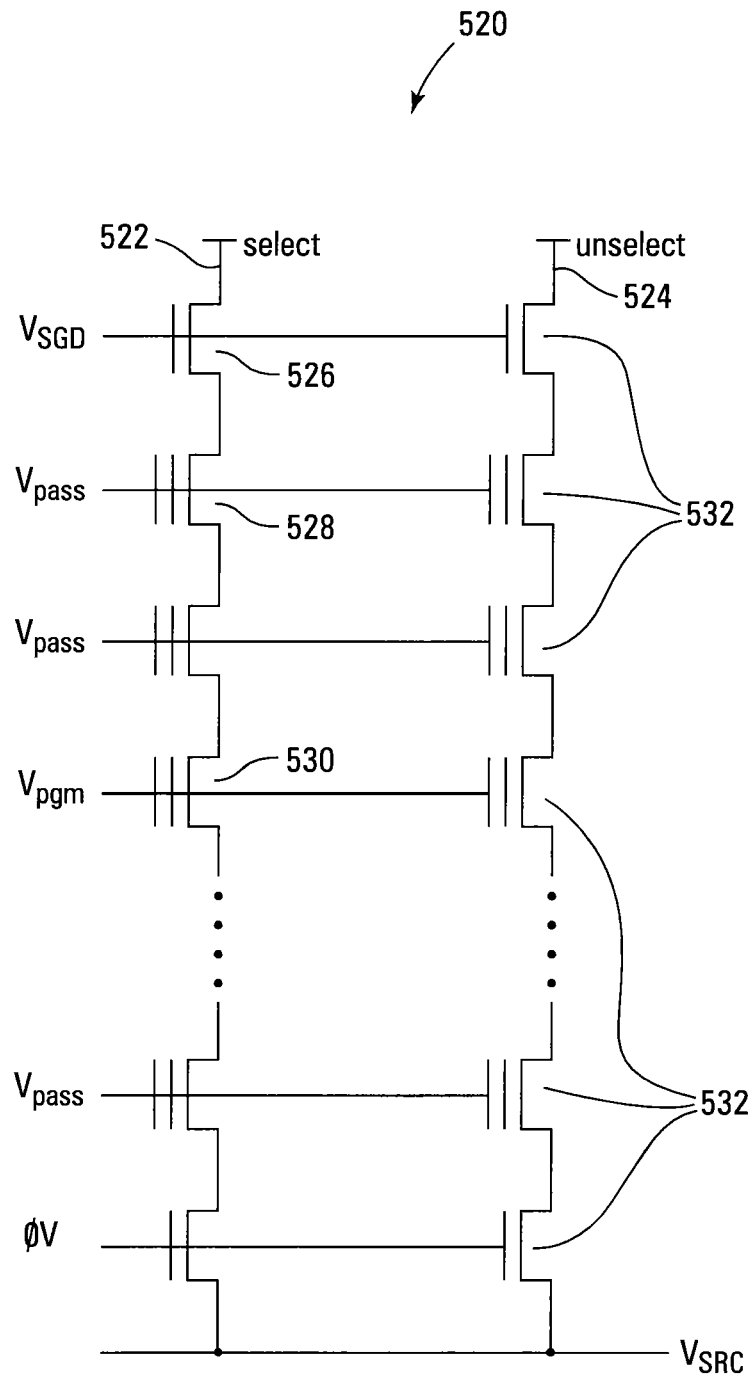
FIG. 5A is a diagram of a portion of a NAND memory with voltages according to another embodiment of the present invention.

Another embodiment of the present invention is shown in FIG. 5A. In this embodiment, punch through is eliminated by managing the voltages for selected and unselected bitlines; the voltages for drain select gate, pass, and program voltages; and the well voltage. Referring to FIG. 5A, a NAND memory 520 is shown in part. Memory 520 has a selected bitline 522 and an unselected bitline 524. In this embodiment, the voltage for the selected bitline (Vbls) 522 is set to approximately equal the source voltage (Vsrc), and both those voltages are set higher than the tub or p-well voltage (Vwell) 532. Optionally, in addition, the unselected bitline voltage (Vblu) is set to be greater than the selected bitline voltage by approximately 2 volts. Alternatively, the selected bitline voltage is set to be greater than 0 volts but still substantially equal to the source voltage and greater than the well voltage. Still further optionally, that is with the selected bitline voltage substantially equal to the source voltage and greater than the well voltage, the well voltage is set to less than 0 volts. In all options, the pass, program, and select gate voltages (528, 530, and 526 respectively) are raised to approximately the level of the selected bitline voltage.

In table form, the bias levels are managed as follows:
Vbls≅Vsrc>Vwell
Vbls≅Vsrc>Vwell and Vblu>Vbls
Vbls≅Vsrc>Vwell and Vbls>0V
Vbls≅Vsrc>Vwell and Vbls>0 and Vwell<0V While there are many bias voltage levels that satisfy the embodiments shown in FIG. 5A, some specific embodiments are particularly amenable to use with those embodiments. For example, in one embodiment, the source voltage and the selected bitline 522 voltages are each approximately 1.5 volts, and the voltage of tub or p-well 532 is 0 volts. In another embodiment, the source voltage and the selected bitline 522 voltages are each approximately 1.5 volts, the voltage of tub or p-well 532 is 0 volts, and the unselected bitline 524 voltage is set to approximately 3.5 volts. In another embodiment, the source voltage and the selected bitline 522 voltages are each approximately equal, the voltage of tub or p-well 532 is 0 volts, and the selected bitline voltage is greater than 0 volts. In yet another embodiment, the source voltage and the selected bitline 522 voltages are substantially the same, greater than 0 volts (for example, 1 volt), the voltage of tub or p-well 532 is approximately −0.5 volts. It should be seen that there are any number of voltages that can be chosen to satisfy the conditions of the embodiment, and that such selections are within the scope of the invention.

As before, the voltage levels shown above with respect to NAND 520 apply equally well to a double select gate NAND such as NAND 300 or NAND 500, where the gate of the first drain select gate transistor is raised to approximately the bias level of the selected bitline, the gate of the second drain select gate transistor is biased to approximately the pass voltage for a read operation, as is the gate of the second source select gate transistor.

The embodiments of the present invention allow the reduction in length of select gates from the current range of 150-200 nanometers to 50 nanometers and less. This reduction in length allows for increased density of components on a die.

Figure 6:
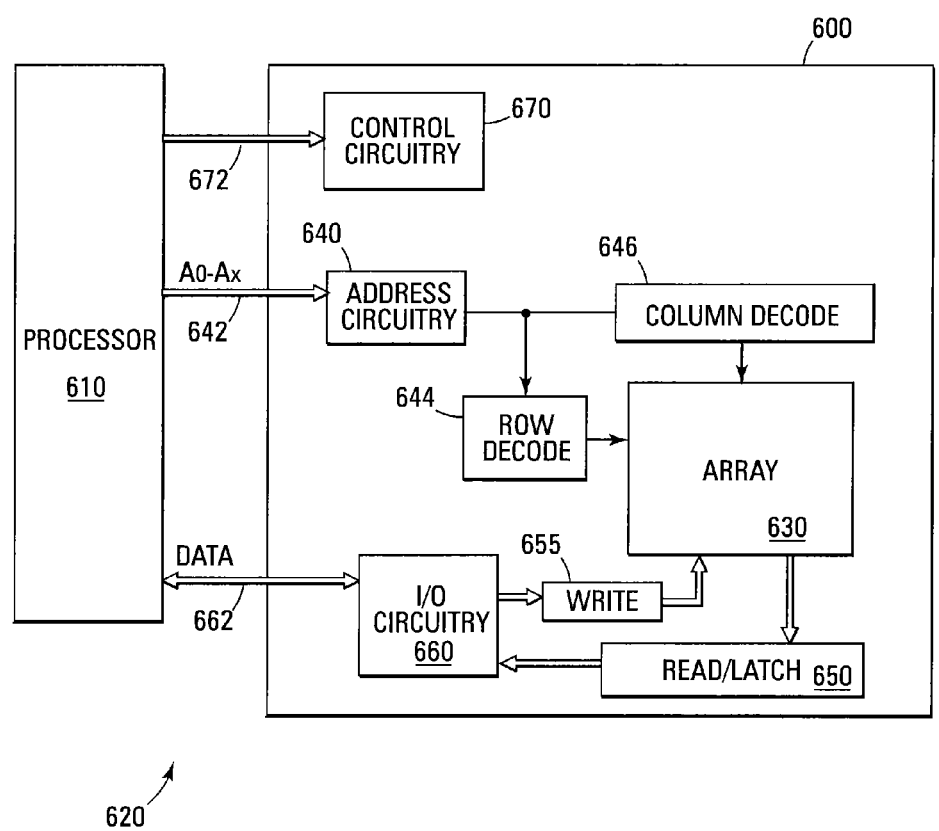
FIG. 6 is a functional block diagram of an electrical system having at least one memory device with a memory array configuration according to one embodiment of the present invention.

FIG. 6 is a functional block diagram of a memory device 600, such as a flash memory device, of one embodiment of the present invention, which is coupled to a processor 610. The memory device 600 and the processor 610 may form part of an electronic system 620. The memory device 600 has been simplified to focus on features of the memory that are helpful in understanding the present invention. The memory device includes an array of memory cells 630 having even/odd bit-line configurations such as those shown in FIG. 2, 3, 4, or 5 and described above. The memory array 630 is arranged in banks of rows and columns.

An address buffer circuit 640 is provided to latch address signals provided on address input connections A0-Ax 642. Address signals are received and decoded by row decoder 644 and a column decoder 646 to access the memory array 630. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 630 by sensing voltage or current changes in the memory array columns using sense/latch circuitry 650. The sense/latch circuitry, in one embodiment, is coupled to read and latch a row of data from the memory array. Data input and output buffer circuitry 660 is included for bi-directional data communication over a plurality of data (DQ) connections 662 with the processor 610, and is connected to write circuitry 655 and read/latch circuitry 650 for performing read and write operations on the memory 600.

Command control circuit 670 decodes signals provided on control connections 672 from the processor 610. These signals are used to control the operations on the memory array 630, including data read, data write, and erase operations. The flash memory device has been simplified to facilitate a basic understanding of the features of the memory. A more detailed understanding of internal circuitry and functions of flash memories are known to those skilled in the art.

Figure 7:
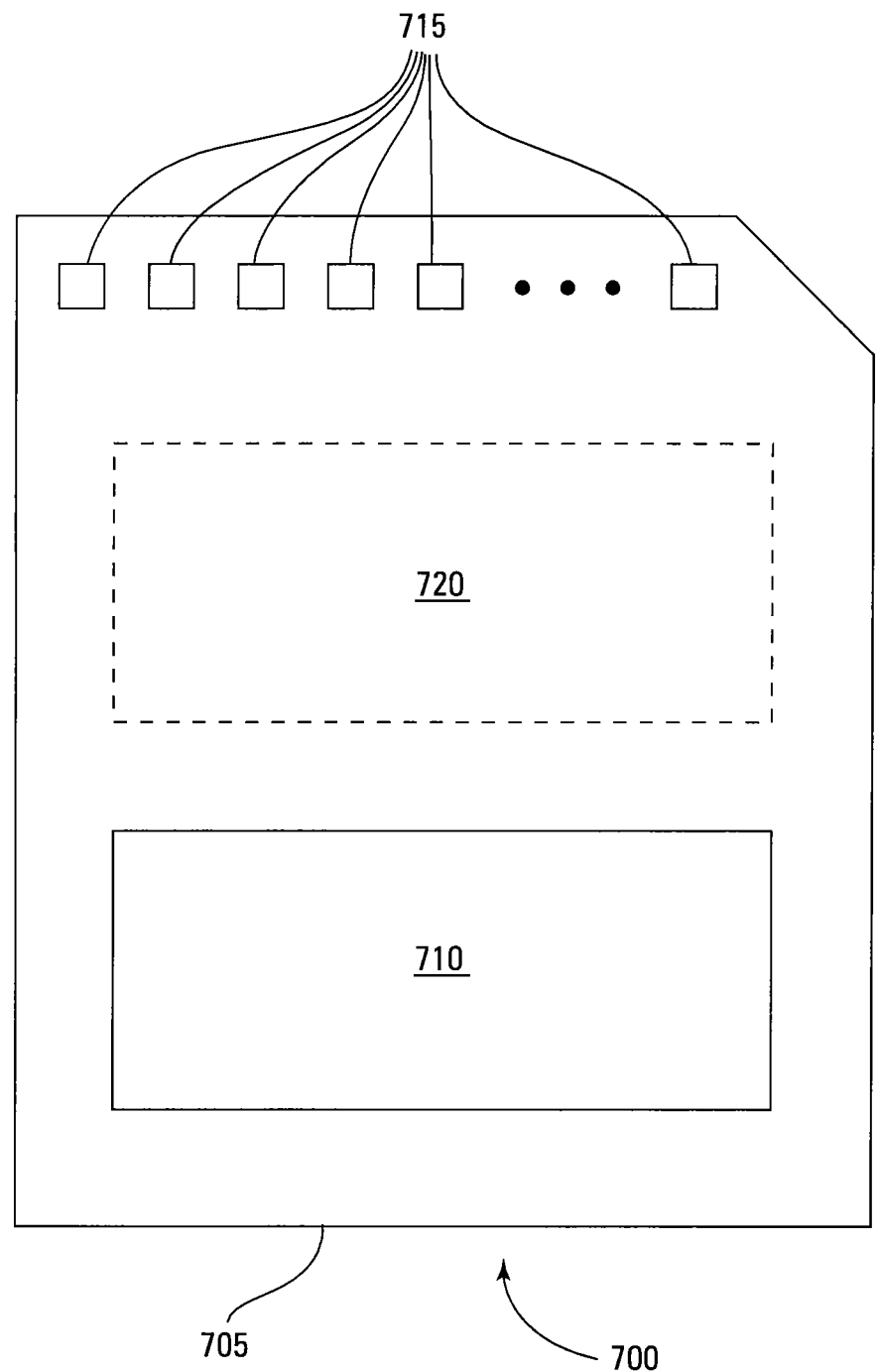
FIG. 7 is a functional block diagram of a memory module having at least one memory device in accordance with an embodiment of the invention.

FIG. 7 is an illustration of an exemplary memory module 700. Memory module 700 is illustrated as a memory card, although the concepts discussed with reference to memory module 700 are applicable to other types of removable or portable memory, e.g., USB flash drives, and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 is a non-volatile memory having voltages applied according to the methods described above according to various embodiments of the present invention, and described above with respect to FIG. 2, 3, 4, or 5. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720 which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC (application specific integrated circuit). Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

Conclusion

A method of programming a NAND memory having a short source-side select gate has been described that includes adjusting voltages of selected bitline, unselected bitline, and drain select gate, pass, and program voltages by an equal amount to that of the selected bitline. Another method of programming a NAND memory having a short source-side select gate includes adjusting a well voltage and a drain select gate voltage to prevent punch through. Other methods are described and claimed.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for operating a memory, comprising:
biasing a well voltage of a selected string of memory cells to a first voltage;
biasing a selected bit line of the selected string of memory cells to a second voltage; and
biasing a source of the selected string of memory cells to a third voltage;
wherein the second and third voltages are substantially equal to each other, and greater than the first voltage.

2. The method of claim 1, wherein the second voltage is greater than 0 volts.

3. The method of claim 1, and further comprising biasing an unselected bit line of an unselected string of memory cells to a fourth voltage, wherein the fourth voltage is greater than the second voltage.

4. The method of claim 1, wherein the first voltage is less than 0 volts.

5. The method of claim 1, wherein second and third voltages are each approximately 1.5 volts.

6. The method of claim 1, wherein the first voltage is 0 volts.

7. The method of claim 3, wherein the fourth voltage is greater than the second voltage by approximately 2 volts.

8. The method of claim 1, and further comprising:
biasing pass, program, and select gates of the memory to the first voltage.

9. A memory, comprising:
an array of memory cells; and
a controller for control and/or access of the array of memory cells, the controller adapted to perform a method comprising:
biasing a well voltage of a selected string of memory cells to a first voltage;
biasing a selected bit line of the selected string of memory cells to a second voltage; and
biasing a source of the selected string of memory cells to a third voltage;
wherein the second and third voltages are substantially equal to each other, and greater than the first voltage.

10. The memory of claim 9, wherein the controller is further adapted to bias the selected bit line to a voltage greater than 0 volts.

11. The memory of claim 9, wherein the controller is further adapted to bias an unselected bit line of an unselected string of memory cells to a fourth voltage, wherein the fourth voltage is greater than the second voltage.

12. The memory of claim 11, wherein the controller is further adapted to bias the unselected bit line to a voltage greater than the selected bit line by approximately 2 volts.

13. The memory of claim 9, wherein the controller is further adapted to bias the well to a voltage less than 0 volts.

14. The memory of claim 9, wherein the controller is further adapted to bias the selected bit line and the source to approximately 1.5 volts.

15. The memory of claim 9, wherein the controller is further adapted to bias the well to 0 volts.

16. The memory of claim 9, wherein the controller is further adapted to bias pass, program, and select gates of the memory to the first voltage.

17. A method for operating a memory, comprising:
biasing a well of a selected string of memory cells to a first voltage;
biasing a selected bit line of the selected string of memory cells to a second voltage; and
biasing a source of the selected string of memory cells to a third voltage;
wherein the second and third voltages are substantially equal to 0 volts, and greater than the first voltage; and
biasing an unselected bit line of an unselected string of memory cells to a fourth voltage, wherein the fourth voltage is greater than the second voltage.

18. The method of claim 17, wherein the first voltage is a negative voltage.

19. The method of claim 17, wherein the fourth voltage is greater than the second voltage by approximately 2 volts.

20. The method of claim 17, wherein the fourth voltage is greater than the first voltage by approximately 3.5 volts.

* * * * *